(12) United States Patent
Forrester

(10) Patent No.: US 7,120,398 B2
(45) Date of Patent: Oct. 10, 2006

(54) MOBILE COMMUNICATION DEVICES HAVING HIGH FREQUENCY NOISE REDUCTION AND METHODS OF MAKING SUCH DEVICES

(75) Inventor: Timothy Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 444 days.

(21) Appl. No.: 10/665,958

(22) Filed: Sep. 18, 2003

(65) Prior Publication Data

US 2005/0064923 A1   Mar. 24, 2005

(51) Int. Cl.
*H04B 1/04* (2006.01)
(52) U.S. Cl. .............. 455/114.2; 455/117; 455/572; 455/296; 455/115.1
(58) Field of Classification Search .......... 455/117, 455/572, 343.1, 300, 301, 114.2, 115.1, 296, 455/298, 299, 90.1–90.3, 550.1
See application file for complete search history.

(56) References Cited

U.S. PATENT DOCUMENTS

| | | | | |
|---|---|---|---|---|
| 4,739,453 A | * | 4/1988 | Kurokawa | 361/816 |
| 5,023,753 A | * | 6/1991 | Abe | 361/782 |
| 5,107,404 A | * | 4/1992 | Tam | 455/348 |
| 5,252,782 A | * | 10/1993 | Cantrell et al. | 361/818 |
| 6,104,920 A | * | 8/2000 | Llewellyn et al. | 455/269 |
| 6,219,258 B1 | * | 4/2001 | Denzene et al. | 361/816 |
| 6,275,683 B1 | * | 8/2001 | Smith | 455/575.1 |
| 6,453,154 B1 | * | 9/2002 | Haber et al. | 45/90.1 |
| 6,483,719 B1 | * | 11/2002 | Bachman | 455/300 |
| 6,625,470 B1 | * | 9/2003 | Fourtet et al. | 455/114.2 |
| 2004/0180644 A1 | * | 9/2004 | Gerhard et al. | 455/326 |
| 2006/0046770 A1 | * | 3/2006 | Zhu et al. | 455/90.3 |
| 2006/0058058 A1 | * | 3/2006 | Zhu et al. | 455/550.1 |

* cited by examiner

*Primary Examiner*—Lana Le

(57) ABSTRACT

In accordance with the disclosed embodiment of the present invention, there is provided a technique to control and manage where the currents flow produced by noise producing components such as transmitters, and how to specifically exclude them from critical areas, such as where noise sensitive components are disposed. Such noise sensitive components may include oscillators and other components. According to a disclosed example of the present invention, an electrically-isolated area at least partially surrounds one or more noise-sensitive components. As disclosed herein, a gap in the elongated area receives one or more traces such as power plane, ground plane and signal traces for the partially surrounded component or components.

5 Claims, 2 Drawing Sheets

MOBILE COMMUNICATION DEVICES HAVING HIGH FREQUENCY NOISE REDUCTION AND METHODS OF MAKING SUCH DEVICES

BACKGROUND OF THE INVENTION

1. Field of the Invention

The present invention relates in general to a new and improved method and apparatus for reducing unwanted high frequency noise in mobile communication devices. It more particularly relates to such a new and improved method and apparatus for eliminating, or at least greatly reducing, unwanted high frequency noise, such as ground plane interference in communication devices such as mobile handsets.

2. Related Art

The related art discussed in this section is considered to be background information only, and is not regarded as prior art.

Current mobile communication devices commonly have severe design requirements for protecting certain more sensitive internal components such as oscillators, against high frequency noise. Such design requirements are oftentimes difficult to achieve for devices such as mobile handsets when attempting to deal with phase noise problems. Such noise reduction considerations can produce unwanted increases in the length of time for the design cycle.

Phase noise reduction within mobile handsets of communication devices has been a problem for designers for some applications. Oscillators within a mobile telephone are susceptible to corruption from other sources due to their close proximity with an enclosure. Such a problem becomes exacerbated with the continual shrinkage of form factors to make the handset smaller in size and more compact to use.

One of the main contributors to phase noise is an effect called "ground bounce". This phenomenon occurs when a high-power noise-producing component such as a transmitter commences operation. Such an operation may cause a sudden in-rush of electrical current. Due to the finite resistance across the metallic or copper clad wiring board, a potential difference is thus created. As the ground return may typically be shared by many parts and components of the handset, oscillators or other noise sensitive components can be adversely affected by the potential difference, which can also be coupled into other parts of the system and thus cause unwanted interference.

In an attempt to overcome these interference problems, the de-coupling capacitors have been employed. Also, ground returns have been connected together to a single ground reference point. None of these solutions have been entirely satisfactory for certain applications.

BRIEF DESCRIPTION OF THE DRAWINGS

In the following, the invention will be explained in further detail with reference to the drawings, in which.

DESCRIPTION OF CERTAIN EMBODIMENTS OF THE INVENTION

In accordance with the disclosed embodiment of the present invention, there is provided a technique to control and manage where the currents flow produced by noise producing components such as transmitters, and how to specifically exclude them from critical areas, such as where noise sensitive components are disposed. Such noise sensitive components may include oscillators and other components. According to a disclosed example of the present invention, an electrically-isolated area at least partially surrounds one or more noise-sensitive components. As disclosed herein, a gap in the elongated area receives one or more traces such as power plane, ground plane and signal traces for the partially surrounded component or components.

Figure 1:
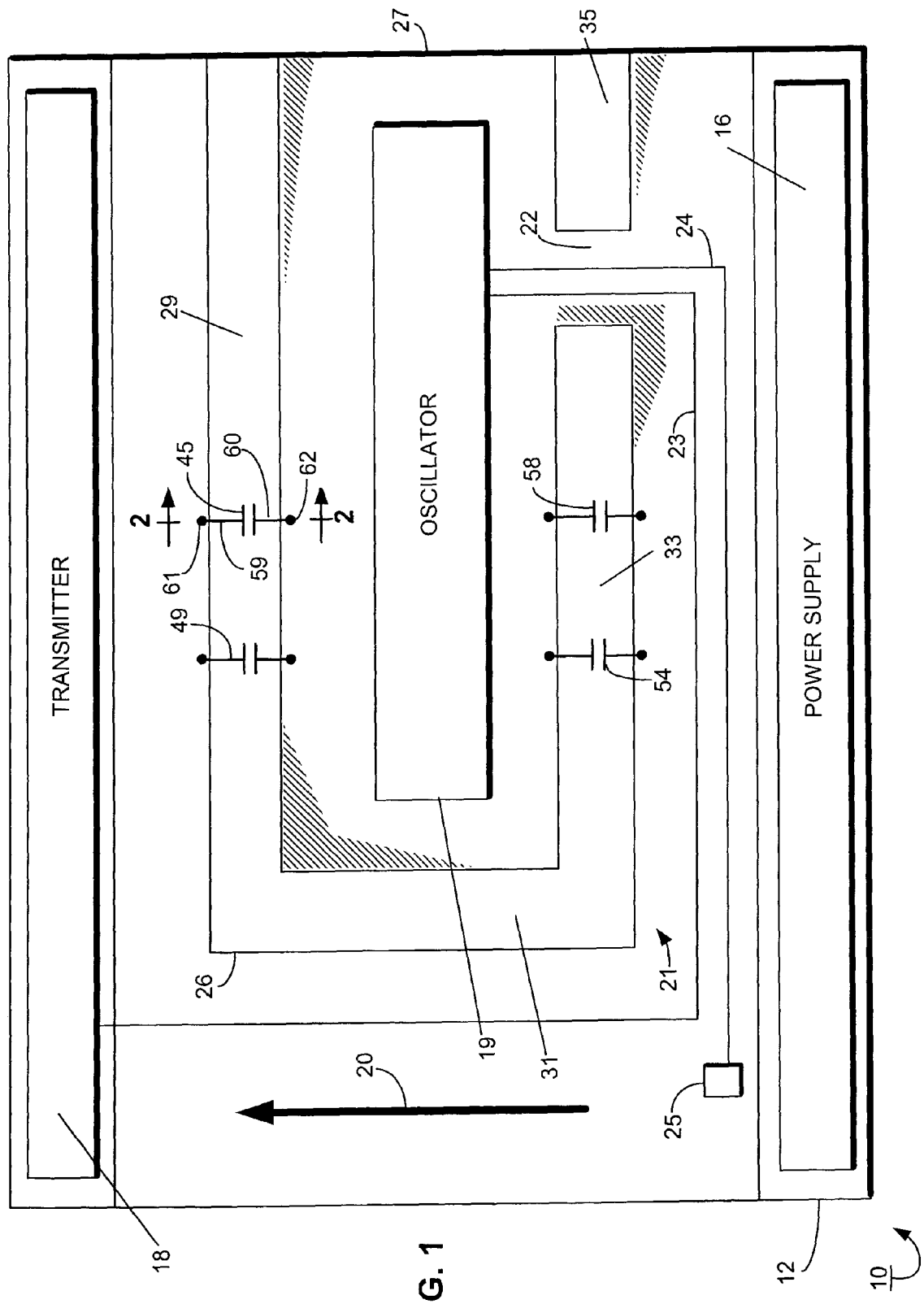
FIG. 1 is a partial diagrammatic plan view of a communication device in the form of a mobile handset illustrating its printed wiring board assembly with the other parts thereof omitted for sake of clarity, in accordance with an example of the present invention.

Referring now to the drawings, and more particularly to FIG. 1 thereof, there is shown a communication device in the form of a mobile handset generally indicated at 10 having a wiring board assembly 12, it being understood that the other portions of the mobile handset 10 being omitted for sake of clarity. The wiring board assembly 12 includes a power supply 16 mounted at one side of the wiring board assembly 12 for powering other electrical components of the mobile handset 10 including a high-power component in the form of a transmitter 18 mounted at the opposite side of the wiring board assembly 12. A noise-sensitive component in the form of an oscillator 19 is also powered by the power supply 16 and disposed intermediate the power supply 16 and the transmitter 18. It should be understood that other components of the wiring board assembly 12 are omitted for sake of clarity.

In operation, when the transmitter 18 is energized by the power supply 16, a large current flow as indicated by the arrow 20 initially flows toward the transmitter 18. In this regard, a voltage drop occurs across the printed wiring board assembly 12. Such a large voltage drop tends to produce a ground bounce effect, which if not otherwise minimized or sufficiently attenuated, could cause phase noise degradation. Also, instability can occur in the oscillator 19.

In order to alleviate the ground bounce phenomenon according to a disclosed embodiment of the present invention, an electrically isolated area generally indicated at 21 of the wiring board assembly 12 at least partially surrounds the noise-sensitive oscillator 19 to help protect it from the in-rush of current as indicated by the arrow 20. In the disclosed embodiment, the isolated area is generally rectangular in shape and includes a gap 22 for permitting a transmitter signal trace 23 to extend through the isolated area 21 to the oscillator 19 so that the oscillator 19 and the transmitter 18 are connected electrically. Similarly, a signal trace 24 extends in the gap 22 between the oscillator 19 and another circuit component 25. It should be understood that the isolated area may have different shapes and sizes depending on the shape and sizes of the components to be protected.

The elongated electrically isolated area includes a generally U-shaped portion 26 which generally surrounds three sides of the oscillator 19 and extend to a wiring board marginal edge 27. The U-shaped portion 26 includes a rectilinear area portion 29 extending adjacent to one side edge of the oscillator 19, a transverse rectilinear area portion 31 extending at right angles to the portion 29 and at right angles to a rectilinear area portion 33 which terminates at the gap 22. A stub rectilinear area portion 35 extends between the gap 22 and the wiring board marginal edge 27. The transverse area portion 31 extends adjacent to one end of the oscillator 19. The portions 33 and 35 are aligned and extend adjacent to the other side edge of the oscillator 19.

Figure 2:
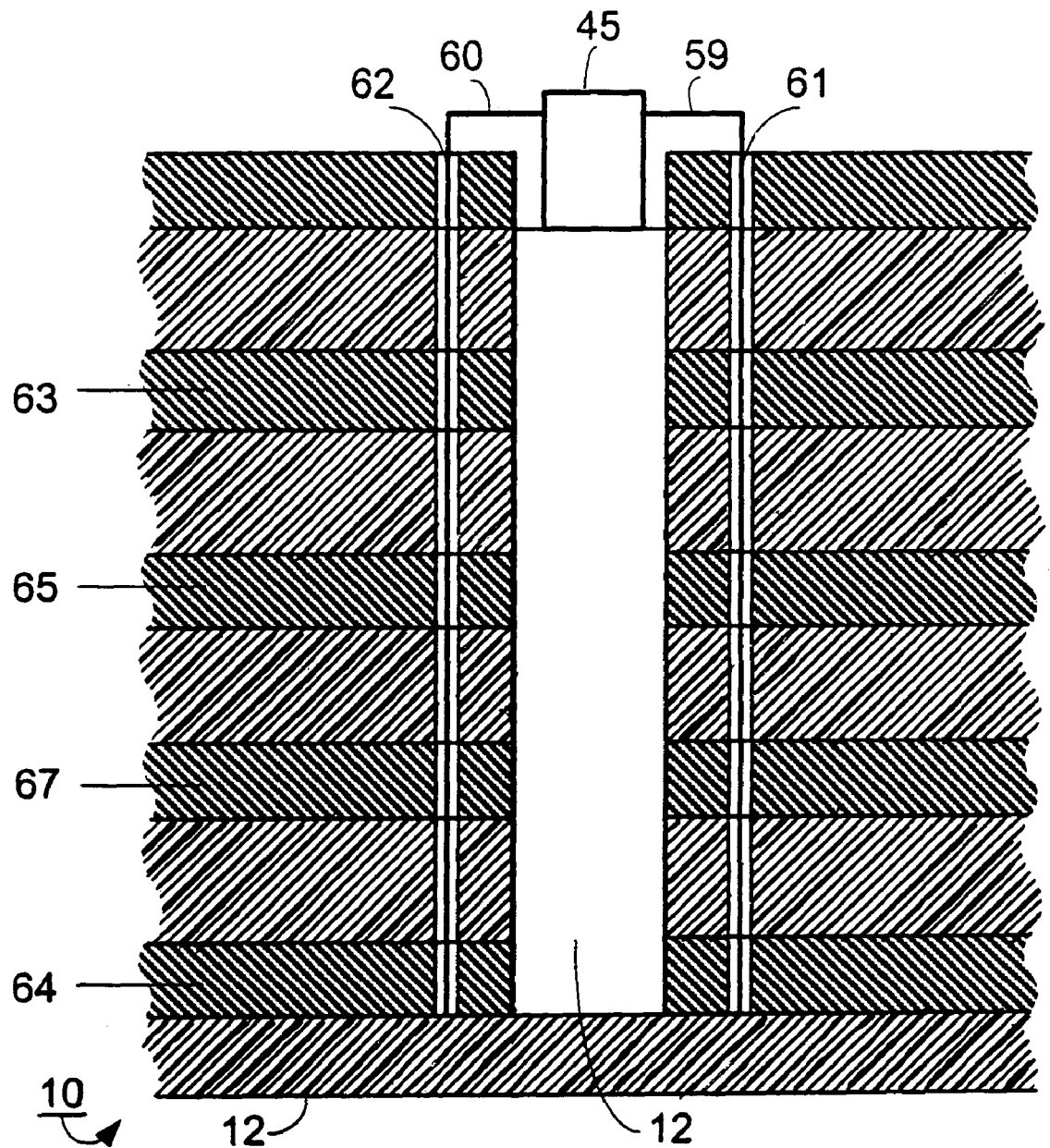
FIG. 2 is a fragmentary sectional view of the construction of FIG. 1 taken substantially on line 2—2 thereof.

A set of radio frequency bridge capacitors 45, 49, 54 and 58 are each connected bridging across the isolated area 21 to serve as a high pass filter. In this regard, as seen in FIGS. 1 and 2, the capacitors, such as the capacitor 45, includes a pair of leads 59 and 60, which extend through via holes 61 and 62 as best seen in FIG. 2. In this regard, the wiring board assembly 12 may include a series of layers including a power plane layer 63, a ground plane layer 64, a signal trace layer 65 and another signal trace layer 67. Thus, in the preferred embodiment of the present invention, the power plane layer 63 and the ground plane layer 64, as well as the signal trace layers, are routed to the oscillator 19 through the common area or gap 22. It should be understood that there may be a variety of different subsets of the power, ground and signal traces routed through the common area or gap 22 in accordance with other embodiments of the present invention (not shown herein).

The bridging capacitors serve as bypass filters to maintain high-frequency radio frequency (RF) currents uniformly across the wiring board assembly 12. It should be understood that there can be a variety of different numbers of capacitors employed, as well as the position or location thereof may be disposed as desired for a given application.

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

What is claimed is:

1. A mobile communication device, comprising:
    a printed wiring board assembly having at least one high-power noise-producing component and at least one noise sensitive component, said assembly further including signal traces;
    means defining an electrically isolated area being configured to at least partially surround at least one of said components, said isolated area is in the form of a narrow band and generally U-shaped; and
    means defining a gap in said area for receiving said traces for the partially surrounded at least one component.

2. A mobile communication device according to claim 1, wherein said isolated area includes a first rectilinear area portion.

3. A mobile communication device according to claim 2, wherein said isolated area includes a second transverse rectilinear area portion extending from said first area portion.

4. A mobile communication device according to claim 3, wherein said isolated area includes a third transverse rectilinear area portion extending between said third area portion and said gap.

5. A mobile communication device according to claim 4, wherein said isolated area includes a fourth stub rectilinear area portion extending between said gap and a marginal edge of said wiring board assembly.

* * * * *